United States Patent [19]

Satomura et al.

[11] Patent Number: 5,424,164
[45] Date of Patent: Jun. 13, 1995

[54] IMAGE FORMING METHOD

[75] Inventors: Masato Satomura; Ken Iwakura; Akira Igarashi, all of Shizuoka, Japan

[73] Assignee: Fuji Photo Film Co., Ltd, Japan

[21] Appl. No.: 338,832

[22] Filed: Nov. 10, 1994

Related U.S. Application Data

[60] Continuation of Ser. No. 980,134, Nov. 23, 1992, abandoned, which is a division of Ser. No. 622,898, Dec. 6, 1990, abandoned.

[30] Foreign Application Priority Data

Dec. 6, 1989 [JP] Japan ................... 1-316953

[51] Int. Cl.$^6$ ............................... G03C 1/72
[52] U.S. Cl. ..................... 430/138; 430/146; 430/151; 430/157; 430/177; 430/180; 430/181; 430/182; 430/211; 430/336; 430/350; 430/351; 503/217
[58] Field of Search .............. 430/138, 171, 211, 157, 430/177, 181, 182, 180, 146, 151, 336, 350, 351, 353; 503/217

[56] References Cited

U.S. PATENT DOCUMENTS

| | | | |
|---|---|---|---|
| 2,551,133 | 5/1951 | Jennings et al. | 430/182 |
| 3,149,972 | 9/1964 | Herrick et al. | 430/180 |
| 3,926,436 | 12/1975 | Monbaliu et al. | 430/548 |
| 4,080,211 | 3/1978 | Van Paesschen et al. | 430/548 |
| 4,737,484 | 4/1988 | Iwasaki et al. | 430/138 |
| 4,743,524 | 5/1988 | Muller et al. | 430/182 |
| 5,236,800 | 8/1993 | Nakamura et al. | 430/151 |

FOREIGN PATENT DOCUMENTS 0323887  7/1989  European Pat. Off. ............ 430/138

OTHER PUBLICATIONS

Encyclopedia of Chemical Technology, 3rd Edition Vol. 8 (1979) New York pp. 900–909.
Hawley's Condensed Chemical Dictionary 11th edition p. 460: New York (1987).

*Primary Examiner*—Janis L. Dote
*Attorney, Agent, or Firm*—Sughrue, Mion, Zinn, Macpeak & Seas

[57] ABSTRACT

A recording material which comprises a support having provided thereon capsules containing a photosensitive diazonium salt, and a polymerizable coupler. The recording material can give a predetermined hue when light, pressure, heat and the like are applied alone or in combination. The main advantages of the recording material are that a specific hue can be selected safely, mixing of colors can be avoided, desensitization problem does not occur and a fixed image can be obtained.

6 Claims, No Drawings

IMAGE FORMING METHOD

This is a Continuation of application Ser. No. 07/980,134, filed Nov. 23, 1992, now abandoned, which is a Divisional of application Ser. No. 07/622,898, filed Dec. 6, 1990, now abandoned.

FIELD OF THE INVENTION

This invention relates to recording materials, particularly a recording material comprising a system which gives an image by light, heat, pressure or by a combination thereof.

BACKGROUND OF THE INVENTION

Various systems have been developed as recording materials making use of energy sources such as light, heat, pressure and magnetic field alone or in combination.

In particular, a number of systems have been proposed in which separation of reactive components by means of encapsulation is used in, for example, impact paper, sensitive impact paper, fixing type sensitized paper and the like. Detailed descriptions about these systems and materials can be seen in, for example, JP-A-54-104910 (the term "JP-A" as used herein means an "unexamined published Japanese patent application"), JP-B-64-7376 (the term "JP-B" as used herein means an "examined Japanese patent publication"), JP-B-64-7377, JP-B-64-7378, JP-A-62-132675, JP-A-62-227784, JP-A-63-186230, JP-A-64-31147, JP-A-64-59345, JP-A-64-60606 and JP-A-64-91130.

The general concept of forming an image by curing capsules making use of the sensitivity of photopolymerization systems has been applied to various fields, but not in a completely satisfactory manner since some problems were left unsolved in the prior art. For example, the prior art had shortcomings such as a desensitization problem attributable to the presence of monomers in a system in which a color former is used, insufficient sensitivity or discrimination and the like in the case of capsules containing a diazonium salt. In addition, other problems regarding preservation, color developing rate, transparency, surface coloring and the like were experienced in the prior art.

This invention offers solutions which overcome these problems encountered in the prior art.

SUMMARY OF THE INVENTION

In view of the above, one main object of the present invention is to provide a recording material which can give a predetermined hue when light, pressure, heat and the like are applied alone or in combination by the effect of the adept use of easily available and highly reactive compounds in the manner discovered by the present inventors.

The principal advantages of the recording material of the present invention are that a specific hue can be selected safely and mixing of colors can be avoided, and, also the above-mentioned desensitization problem does not occur and a fixed image can be obtained.

More particularly, in accordance with the present invention, a recording material is provided which is light-sensitive, thermo-sensitive and pressure-sensitive.

It is another object of the present invention to provide a recording material which can be fixed.

It is still another object of the invention to provide a recording material which is light-sensitive and thermo-sensitive.

It is a further object of the invention to provide a recording material in which an unexposed portion develops a color when heat or pressure is applied after light-sensitization.

It is a still further object of the invention to provide a recording material in which the photosensitivity of a diazonium salt and photopolymerization of a vinyl compound are combined.

It is another object of the invention to provide a recording material in which the sensitive wavelength of a diazonium salt is utilized.

It is further object of the invention to provide a recording material in which the sensitive wavelength of a photopolymerization initiator of a vinyl compound is utilized skillfully.

It is among the objects of the invention to provide a recording material which can give an image even in the case of monosheet transfer.

It also is an object of the present invention to provide a recording material in which preservation capacity is improved.

A further object of the present invention is the provision of a recording material which causes no desensitization by vinyl monomers.

Still a further object of the invention is the provision of a recording material which can be applied to a multicolor recording material.

Another important object of the present invention is to provide a recording material in which capsules containing a diazonium salt and, when required, a vinyl monomer and a photopolymerization initiator are used.

An even further object of this invention contemplates the provision of a recording material in which a polymerizable coupler (coupler monomer) is utilized.

Other objects and advantages of the present invention will be made apparent in the description hereinafter.

The aforementioned and other objects and advantages of the present invention have been attained by a recording material comprising a support having provided thereon capsules containing a photosensitive diazonium salt, and a polymerizable coupler.

DETAILED DESCRIPTION OF THE INVENTION

In the practice of the present invention, the photosensitive diazonium salt may preferably be selected from those salts which are soluble in oil. Examples of these preferable salts are disclosed in JP-A-62-132675 and JP-A-62-142686 which have been applied by the present inventors.

Any compound which develops a color upon a coupling reaction with a coupler, is decomposed by light and is soluble in oil may used as the photosensitive diazonium salt of the present invention. Preferable diazonium salts for use in the present invention may be derived from aromatic amines, more preferably from anilines having at least one substituent group (for example, substituted amino, alkyl, alkoxy, aryloxy, arylthio, alkylthio and aryl amino, as well as halogen atom). Also preferable are derivatives of diaminobiphenyl such as bisphenetidine and dibutoxybenzidine. An aromatic ring may be selected from pentagonal or hexagonal rings, such as benzene ring, naphthalene ring and pyridine ring.

Illustrative examples of the diazonium port on of the diazonium salt include 4-diethylamino-1-diazobenzene, 4-diazo-1-dibutylaminobenzene, 4-diazo-1-methylbenzylaminobenzene, 4-diazo-o-dibenzylaminobenzene, 4-diazomorpholinobenzene, 4-diazo-N-ethoxyethylanilin, 4-diazo-1-diethylamino-2-methylbenzene, 4-diazo-1-methylbenzoilaminodiethoxybenzene, 4-diazo-1-morpholinobenzene, 4-diazo-2,5-diethoxybenzene-1-morpholinobenzene, 4-diazo-1-tolylaminobenzene, 4-diazo-1-tolylmercaptobenzene, 4-diazo-1-methoxybenzoilamino-2,5-diethoxybenzene, 4-diazo-1-pyrrolidino-2-butylbenzene, 4-diazo-3-butoxy-morpholinobenzene, 4-diazo-2-chloro-5-butoxybenzene, 4-morpholino-2,5-diisopropoxybenzene diazonium, 4-N-hydroxyethylanilin diazonium, 2-N,N-dibutyl-m-ethylanilin diazonium, 4-morpholino-3-ethylbenzene diazonium and the like.

Examples of counter-ion forming acid anions useful as the salt portion include aliphatic or aromatic carboxylic acids or sulfonic acids, phosphorus compounds and boron compounds, and, more particularly, a long chain alkyl group or a substituted alkyl group with fluorine atom, a hexafluorophosphate, a tetraphenylboron, a tetraarylboron obtained from a substituted phenyl group with one or two trifluoromethyl group.

The total number of carbon atoms of the above-mentioned substituent group may preferably be 30 or less, more preferably within the range of from 4 to 25. A number of carbon atoms of 3 or below might cause a problem of inferior solubility in oil. On the other hand, inferior color development might occur when the carbon atom number is 30 or above. Preferable substituent groups may be selected in such a manner that, when a diazonium salt is formed, it has a solubility of 1% or higher, especially 3% or higher, in butyl acetate or in tricresol phosphate. Regarding the anion portion, an oil-soluble hexafluorophosphate, especially having a melting point of 35° C. or higher, preferably 45° C. or higher, is preferable in view of cost and handling. These preferred modes are described in detail in the aforementioned JP-A-62-132675, JP-A-62-142686 and other patents.

If necessary, above-described photosensitive diazonium salts may be used jointly with a small amount of other commonly used diazonium salts. Such a modification is described for example in JP-A-64-32254, JP-A-64-67379, JP-A-1-104661 and JP-A-1-58424.

According to the present invention, multiple color recording can be attained by a combination of a diazonium salt and a coupler. In such a case, two or more kinds of photopolymerization initiators having different sensitive wavelengths are used.

Diazo coupling, coloring auxiliary, lake formation, stabilizer and the like are well known and described in detail in the aforementioned patents and references (for example, Saunders, *Aromatic Diazocompounds*, Ernest Arnold Co. (1985), and Zollinger, *Azo and Diazochemistry*, Interscience (1987)).

It is evident that easy modifications of conditions, such as temperature, base, molar ratio and auxiliary, will be apparent to those skilled in the art in light of the description in these patents and references. Accordingly, it is intended to include all such modifications as set forth within the spirit and scope of the present invention.

A small amount of a water soluble diazonium compound may be used jointly with the diazonium salt of the present invention. A preferable example of such a water soluble compound is an aromatic, hetero ringed or aliphatic diazonium compound of non-coloring type. Examples describing the use of such compounds are described in detail, for example, in JP-A-1-158424, JP-A-1-156737, JP-A-1-104661, JP-B-1-41516, JP-A-64-67379, and JP-A-64-32254.

As described above, multiple color recording can be attained by a combination of a diazonium salt and a coupler. In such a case, not only the formation of multiple layers is preferable, but also it is important to select a photopolymerization initiators for each layer in such a way that sensitive wavelengths of these initiators are substantially different from one another.

Methods for diazo coupling and color development, methods for lake formation and treatment, application methods, other additives such as supporting substrates, and the like are well known as an ordinary procedure. For example, useful data about conditions to be employed, temperature, base, molar ratio and the like are described in detail in the aforementioned references.

Capsules in which the photosensitive diazonium salt is contained may be prepared by applying commonly used means, for example, by emulsifying and dispersing a diazonium salt-containing core material in an aqueous medium and by forming a high molecular weight material around the oil drops.

Illustrative examples of such a high molecular weight material include a polyurethane, a polyurea, a polyamide, a polyester, a polycarbonate, a urea-formalin resin, a melamine-formalin resin, gelatin, a poly-urethane-urea and the like. Especially preferred are a polyurethane, a polyurea and a polyurethane-urea made of various isocyanates as the starting material.

Detailed preparation methods of capsules are described in the aforementioned patents applied by the present inventors, as well as in U.S. Pat. Nos. 3,726,804, 3,796,669, 3,914,511, 4,001,140, and 4,025,455.

The particle size of capsules may vary depending on the type and object of the recording material to be obtained, but is preferably 10 microns or less, more preferably 5 microns or less, most preferably from 5 to 0.3 microns.

The diazonium salt for use in the present invention may exist in various modes, such as coexistence with a solvent as the core material, and coexistence with a monomer and an initiator which will be described hereinafter. When a solvent is used as the core material, an aromatic hydrocarbon, a phosphate ester, a fatty acid ester and a chlorinated paraffin or joint use of these solvents with a paraffin, which are currently used in the field of impact paper and photography, may be effective. Monomers, (meth)acrylates or oily diazonium salts may also be used as substitutes.

Illustrative examples of such solvents include: ketones such as KMC, Hisol, tricresyl phosphate, octyldiphenyl phosphate, dibutyl phthalate, dibutyl succinate, triacetyl glyceline, diethyl adipate, dioctyl adipate, diphenyl carbonate, kerosene, chlorinated paraffin, liquid paraffin, methyl ethyl ketone and cyclohexanone; aromatic hydrocarbons such as toluene and xylene; Cellosolves such as Cellosolve and butyl Cellosolve; carbitols such as carbitol and butylcarbitol; and acetic acid esters such as ethyl acetate, butyl acetate, Cellosolve acetate, butyl Cellosolve acetate, carbitol acetate and butylcarbitol acetate. These organic solvents may be used alone or as a mixture of two or more thereof.

If necessary, a base may be used in order to enhance the reaction (mainly enolization). Not only a base but a base precursor which releases a base by the action of light or heat and renders the atmosphere alkaline in condition may also be used for this purpose. The base or the base precursor may be used with a polymerizable coupler in the form of an emulsion. Well known and usable base precursors are derivatives of guanidine, amidine, piperazine, morpholine, aniline, imidazole, pyridine and the like. These derivative are currently used in the field of heat developing and are described in detail in, for example, the aforementioned JP-A-62-132675 and JP-A-62-142686. Illustrative examples of these derivatives include tricyclohexylguanidine, triphenylguanidine, tritolylguanidine, bis-3-phenoxy-2-oxypropylpiperazine, tribenzylamine, laurylimidazole, phenylimidazole, guanidine-trichloro acetate, bistolylacetoamidine and the like. Especially, a derivative which is refractory or insoluble in water may be convenient because such a derivative can be used by means of emulsion-dispersion, dispersion or encapsulation.

In accordance with the present invention, the term "polymerizable coupler", i.e. coupler monomer, means a compound which has both a coupling portion and a polymerizable portion. The polymerizable coupler has at least one polymerizable group.

The polymerizable portion (group) may be selected form an unsaturated fatty acid derivative, stilbazole, chalcone, maleimide or the like having an inner olefin or a terminal olefin such as (meth)acryl or vinylallyl as a polymerizable group. Preferable examples are unsaturated fatty acid derivatives especially of terminal olefin types such as (meth)acrylate and (meth)acrylamide, as well as vinyl ether and styrene.

A suitable monomer may have a plurality of functional groups. Such a monomer having functional groups is preferable in terms of gelation enhancement and discrimination. Various types of polymerizable couplers (coupler monomers) are known, which react with a color developer of oxidized aromatic primary amine type and give a color of cyan, magenta, yellow or the like. The pigment formed according to the present invention is known well as an azo dye in the field of dyestuffs.

Suitable polymerizable coupler are disclosed, for example, in JP-A-57-94752 (corresponding to U.S. Pat. No. 4,367,282), JP-A-62-276548 (corresponding to U.S. Pat. No. 4,874,689), JP-A-1-213694, U.S. Pat. Nos. 3,767,412, 3,926,436 and 4,080,211, British Patent 1,247,688 and German Patent 2,725,591. Illustrative examples are described in detail on pages 496 to 498 in the specification of JP-A-62-276548 (corresponding to U.S. Pat. No. 4,874,689) and on page 560 and page 568 in the specification of JP-A-1-213649. Of course, a polymerizable coupler can be selected in light of these illustrative examples depending on the intended hue, reactivity, oil solubility, diffusion capacity, heat stability, stability with the lapse of time and the like.

Phenol, naphthol, pyrazolone, pyrazolotriazole, aroylacetic amide, barbituric acid, 2,5-dihydroxypyridine or the like may be used effectively as the mother nucleus having a coupling portion in the polymerizable coupler. Such mother nuclear may have various substituent groups for the purpose of improving solubility, stability, reactivity and the like, provided that the polymerization reaction or the diazo coupling reaction is not inhibited.

A divalent group having 26 or less carbon atoms selected from an ester, an ether, a urethane, an alkylene, an aromatic ring and the like, may be inserted between the polymerizable group and the coupling portion in the polymerizable coupler. As will be described below in the section concerning unsaturated fatty acid derivatives, various coupling groups could be formed. In other words, the polymerizable coupler may have a divalent group having 26 or less carbon atoms selected from an amide, an ester, a urethane, an ether and an aromatic ring.

With regard to the polymerizable portion, as described above, derivatives obtained from (meth)acrylate, acrylamide, styrene or the like are preferable in view of the availability and reactivity of the material. In the case of 5-pyrazolones, the polymerizable group may preferably be in the 1- and/or 3-positions. In the case of benzoylacetanilide types, a structure in which a polymerizable group is incorporated into one of the aromatic rings as a derivative of acrylic acid or a derivative of styrene may be preferable from the viewpoint of synthesis, polymerization, purification and the like, as well as a bis-type. Especially, an ester, a urethane, an amide and the like are preferable from the viewpoint of reactivity and handling considerations.

In the present invention, active methylene types of coupling portion are used most preferable in view of the reactivity. In a system in which diazo coupling reaction is employed, it is preferred that the coupling portion be hydrogen atom.

Even if a coupling portion has an elimination group such as sulfo, iodine atom, bromine atom, carboxy, methylol, substituted carbamoyl or the like, the reaction sometimes proceeds smoothly in correlative relation to the activity of diazonium salts. Therefore, these elimination groups may also be used conveniently. Such information is well known and described in detail, for example, in Hirashima et al., *Kagaku-to-Kogyo* (*Science and Technology*), Vol. 60, No. 8, 307–314 (1986), and other diazo-related references.

Though these specified elimination groups can be used, a hydrogen atom is the most advantageous basically because of easy handling, low cost, easy obtainment and the like. This is greatly different from a system in which a silver salt is used. On the other hand, the improvement of the reactivity of diazo coupling reaction by alkaline condition resembles a case of the enhancement of oxidation coupling reaction by alkaline condition in a system in which a silver halide is used.

Other commonly used couplers may jointly be used as has been described in detail, for example, in JP-A-1-104661, JP-A-64-67379 and JP-A-64-32254, as well as in the aforementioned patents.

As disclosed in detail in the aforementioned patents, the term "coupler" means a component which develops a color by reacting with a diazonium salt through a coupling reaction.

Since the polymerizable coupler of the present invention has a curable group (polymerizable portion) and a coupling portion, a recording material prepared making use of the polymerizable coupler is easily cured by radiation, light, heat or the like, and is remarkably durable because dyestuffs formed by diazo coupling is connected to a high molecular weight chain by, if necessary, further continuing the polymerization after the diazo coupling. Moreover, characteristics of the recording material can be regulated by selecting an appropriate copolymer.

In the practice of the present invention, the molar ratio of such a polymerizable coupler to a diazonium salt is preferably from about 10 or below to 1, more preferably from about 0.90–5 to 1. Couplers, handling methods, conditions to be employed and the like are described in detail in related books, for example, James, *The Theory of Photographic Process*, fourth ed., MacMillan Pub (1977).

In the diazo coupling reaction of the present invention, the reactivity of an active methylene type is sometimes higher than that of substituents, which is greatly different from a system in which a silver salt is used. The improvement of the reactivity of diazo coupling reaction by alkaline condition resembles a case of a system in which a silver halide is used. Consequently, a light or heat alkali generater can be used, and formation of an image under a semi-dry condition is possible. Such a means is known as heat developing.

A polymerizable coupler having a photocurable and coloring reactive portion is allowed to react with a diazonium salt, and, after light irradiation, a dye portion is introduced as covalent bonding by diazo coupling before, during or after the developing. By performing such a process, an image with improved chroma, accuracy, transparency and durability is formed and the sensitivity is improved.

According to the present invention, discrimination and sensitivity can be improved by using the polymerizable coupler jointly with a component having at least one polymerizable group. Such a component having a polymerizable group may be selected form various compounds which have been developed for use in resist, plate, relief, paint and the like.

Vinyl compounds having at least one curable substituent group have been examined in the prior art as polymerizable or curable monomers, with the typical examples being styrene, (meth)acrylate, (meth)acrylamide and allyl compounds. The following discussion describes unsaturated fatty acid derivatives because they are the most typical example of such vinyl compounds due to their easy access.

Examples of suitable unsaturated fatty acids as the portion of these derivatives include cinnamic acid, α-cyanocinnamic acid, phenylpentadienoic acid, thienylpentadienoic acid, butoxycarbonylvinylcinnamic acid, methylfurylacrylic acid, naphthylacrylic acid, ethylthienylacrylic acid, furylpentadienoic acid, p-ethoxycarbonylcinnamic acid, α-cyanosorbic acid, hexylcrotonic acid, dimethylmaleic anhydride, maleic anhydride, cinnamylideneacetic acid monoethyl, cyanothienylpentadienoic acid and p-phenylenediacrylic acid monoethylester, as well as (meth)acrylates or (meth)acrylamides of these unsaturated fatty acids and vinyl monomers having hydroxy group or amino group. A vinyl monomer having dihydroxy group, or amino group and hydroxy group or two amino groups may also be useful in this regard.

Consequently, the following unsaturated fatty acid derivatives, monomers of azide or acid azide derivatives and the like may be useful: cinnamoyloxyethyl (meth)acrylate or amide; cinnamoyloxypropyl (meth)acrylate or amide; (meth)acryloxyethylphenylpentadienoate; (meth)acryloxybutyl-α-cyanocinnamate; phenylenediacrylate-monoethylestermethacrylate; a (meth)acrylate, a styrene or a (meth)acrylamide having β-aryl substituted acrylic acid ester or amide group as disclosed in German Patent 2,164,625, JP-A-49-36794, JP-A-49-38987 (corresponding to U.S. Pat. No. 3,826,784), JP-A-49-60390, JP-A-49-0103975 (corresponding to U.S. Pat. Nos. 3,931,248 and 4,041,017), JP-A-49-107226 (corresponding to U.S. Pat. Nos. 3,933,885 and 4,065,430) and other patents; a vinylcinnamic acid ester or amide; a (meth)acrylate or styrene having azide group; a (meth)acrylate, a (meth)acrylamide or a styrene having δ-aryl substituted pentadienoic acid ester or amide group; a (meth)acrylate or amide of chalcone having hydroxy group or amino group; a (meth)acrylate or amide of cinnamic acid ester or amide having hydroxy group; and other derivatives.

Also useful as the additional component having at least one polymerizable group are maleimide type monomers having, for example, dialkyl substituted or alkylaryl substituted maleimide portions, such as dimethylmaleimide-N-(meth)acryloxypropyl and (meth)acryloxyethoxyethyl-1-naphthyl-2-methylmaleimide. Also included in this category are monomers prepared from stilbazoles having inner olefin bonding, such as 4-(meth)acryloxyethyloxystilbazolium tosylate and 4-N-(meth)acryloxypropoxystilbazolium iodide, as well as similar monomers derived using other functional groups such as stilbene, coumarin, cyclopropenone and the like, which can easily be prepared by those skilled in the art. Another useful derivatives to be included in the present invention are quinone diazides (polymer and non-polymer) disclosed in U.S. Pat. No. 4,141,733 a photosensitive polycarbonate disclosed in U.S. Pat. No. 3,511,611, a diazonium salt, a diazo resin and a cinnamal malonic acid and its equivalent products disclosed U.S. Pat. No. 3,342,601 and a photosensitive polyester, a photosensitive polycarbonate and a photosensitive polysulfonate disclosed in U.S. Pat. No. 4,139,390.

Advantages of these curable functional groups are that a high sensitivity can be attained because of the ability to use a photopolymerization initiator efficiently in addition to their excellent heat stability.

Their quantitative relationship, coating thickness and the like may be determined depending on variables such as the kind of coupling group, other monomers and the like.

Various other monomers may also be usable, such as vinylpyrrolidone, diethylaminoethyl (meth)acrylate, diethylaminomethylstyrene, dimethylaminobutyl (meth)acrylate, acetoacetoxybutylmethacrylate, acetoacetoxyethyl (meth)acrylate or styrene, methylmethacrylate, hydroxyethyl (meth)acrylatehexylmethacrylate or acrylamide, butoxyethyl (meth)acrylate (meth)acrylic acid, acryloxyethyl (meth)acrylic acid or acrylamide, vinyl acetate, Cellosolve (meth)acrylate, vinyltoluene, α-cyano-4-methoxycinnamoiloxyethyl (meth)acrylate, acrylonitrile and the like.

A monomer having at least two ethylene type unsaturated bonds may especially be effective on discrimination and curing rate. These are known as polyfunctional monomers, with the typical examples being (meth)acrylates, styrenes, allyl ethers, vinyl ethers and (meth)acrylamides derived from polyols, polyamines or polyamino-alcohols.

The following polyfunctional monomers or various mixtures thereof may be used as the starting material: ethyleneglycol, propanediol, butanediol, hexanediol, butinediol, cyclohexanediol, xylylenediol, bishydroxyethoxybenzene, bishydroxyethoxycyclohexane, phenylglycol, diethanolamine, ethanolamine, trimethyloletane or propane, pentaerythritol, dipentaerythrite, sorbitol, hydroxyethylsorbitan, benzylamine, ethylenediamine, tetraethylenediamine, hexamethylenediamine, triethylenetetramine, trisaminoethylamine, bisaminopropylethylenediamine, xylylenediamine, glutaric acid, sebacic acid, phthalic acid, adipic acid, benzenedisulfonic acid, divinylbenzene and the like. Also useful are ARONIX M 5700, 6100, 152, 215 and 315, NK Ester ABPE4, U4HA and CB1, KAYARADR614, DPCA31 and 60, KAYAMARPM2, PHOTOMA 4051 and 5007, Lipoxy VR60 and 90, SPIRAK E4000X and U3000 and the like which can be obtained from Toagosei Chemical Industry Co., Ltd., Shin-Nakamura Chemical Co., Ltd., Nippon Kayaku Co., Ltd., San Nopco Ltd., Showa Highpolymer Co., Ltd.

These monomers may be used for the purpose of improving contrast between exposed and unexposed portions, but within such a range that they do not substantially disturb the reaction of the polymerizable coupler with a diazonium salt. The preferable range of these monomers is from 10 mol percent to 560 mol percent of the polymerizable coupler used.

Various characteristics, such as durability, solvent capacity, photo resistance, hardness, plasticity, viscosity, dispersion stability, development aptitude, transparency and the like, can be changed sharply by proper selection of structure and amount of a monomer. The general relationship between changes in these monomers and physical properties of polymers obtained therefrom is known in the field of ink, paint and the like or in the field of plate.

Synthesis of these monomers may be performed in accordance with commonly used methods in the light of the aforementioned patents and the like. For example, a reaction of an active group (such as amino, hydroxy, vinyl, glycidyl or halogen atom) with a group having a polymerizable group or a coupling portion (such as an acid or an acid halide) is known as a unit operation. Reaction conditions are described in detail in the aforementioned patents, as well as in related books for example in *Shin Jikken Kagaku Koza* (New Experimental Chemistry Course) published by Maruzen, Japan.

It is a matter of course that, as described above, a multiple color image can be obtained by repeatedly coating a component in which its coupler portion or sensitive range of a photopolymerization initiator is changed in each sequential coating. A multiple color image may also be obtained by preparing various combinations of diazonium salts having different sensitive wavelengths with different couplers.

Many suitable application techniques for use in image formation in the present invention are described in detail in many books and patents, for example; J. Kosar, *Light Sensitive Systems*, John Wiley & Sons; Kadota, *Kankosei Jushi* (Light Sensitive Resins), The Japanese Society of Printing Sciences and Technology; Warashina, *Kankosei Kobunshi* (Light Sensitive High-polymers), Kodansha, Japan; JP-A-1-105944; and the aforementioned patents.

With regard to the photopolymerization initiator, a compound which can enhance crosslinking and polymerization of unsaturated fatty acid derivatives can be used conveniently, preferably in the form of an emulsion with a polymerizable coupler. Such compounds are well known and described in detail in many patents, for example, JP-A-57-179836, JP-A-62-143044 (corresponding to U.S. Pat. Nos. 4,772,541, 4,800,149 and 4,865,942), and U.S. Pat. Nos. 4,632,899, 4,634,657, 4,647,952, 4,670,347, 4,701,402, 4,716,095, 4,753,865 and 4,139,390.

Typical examples of these compounds are aromatic ketone, nitro, quinone or amine compounds and cyanin borate or combinations thereof, a 3-substituted coumarin, an amino substituted ketocoumarin, 2-acylmethylenethiazoline or selenazoline, N-phenylthioacridone, thiapyrilium perchloride, quinalizone and the like. The preferred amount of these compounds to be used may be about 0.08 to 30 parts, more preferably 1 to 10 parts, by weight based on 100 parts by weight of photopolymerizable compound.

Illustrative examples of these compounds include: α-diketones such as dibenzyl and diacetyl; acyloins such as benzoin; acyloin ethers such as benzoinmethyl ether, benzoinethyl ether and benzoinisopropyl ether; thioxanthones such as thioxanthone, 2,4-diethylthioxanthone, thioxanthone-1-sulfonic acid and thioxanthone-4-sulfonic acid; benzophenones such as benzophenone, 4,4'-bis(dimethylamino)benzophenone and 4,4'-bis(diethylamino)benzophenone; acetophenones such as acetophenone, p-dimethylaminoacetophenone, α,α'-dimethoxyacetoxyacetophenone, 2,2'-dimethoxy-2-phenylacetophenone, p-methoxyacetophenone and 2-methyl-[4-(methylthio)phenyl]-2-morpholino-1-propanone; quinones such as anthraquinone and 1,4-naphthoquinone; halogen compounds such as phenacyl chloride, tribromomethylphenylsulfone and tris(trichloromethyl)-s-triazine; peroxides such as di-t-butyl peroxide; and the like.

These photopolymerization initiators may be used alone or as a mixture of two or more thereof with a preferable amount of 0.08 to 30 parts by weight, more preferably 0.1 to 15 parts by weight, most preferably 1 to 10 parts by weight, based on 100 parts by weight of photopolymerizable compound. These photopolymerization initiators may also be used together with a ketone type or azide type photopolymerization initiator which reacts as a crosslinking agent, such as Michler's ketone or dibenzalacetone.

When applied to a recording material, various additives, such as a surfactant, a plasticizer, a dyestuff, a pigment, a stabilizer, an antioxidant, a initiator, a development auxiliary, a development accelerator, a latex, a mat, a binder and the like, may occasionally be used in accordance with common practices. Dyestuffs and pigments for such an occasional use are disclosed in detail, for example, in JP-B-61-36872 (corresponding to U.S. Pat. No. 4,284,710), JP-A-1-205149, and U.S. Pat. Nos. 4,806,451 and 4,427,738, and initiators, stabilizers and the like are disclosed in detail in, for example, JP-A-64-48059, JP-A-1-31147, U.S. Pat. Nos. 4,822,719 and 4,816,379.

The size of a dyestuff, a pigment or a mat may vary depending on the object, but it may be 10 microns or less, preferably 3 microns or less, in view of considerations such as the dispersion stability, transparency, smoothness and the like. Various forms, additives, procedures, supporting materials, coating methods and the like are described in detail in the patents mentioned immediately above and in the aforementioned patents and books.

The recording material of the present invention, in which high molecular weight polymers having specific functions are employed, has remarkably excellent ability to hold a dyestuff because the dyestuff is fixed and shows remarkably good hue due to the use of a diazo dyestuff.

According to the present invention, any of TAC, WP paper, glass, epoxy, aluminum, PET, polyimide and the like can be used as the support depending on the object and not depending on the quality, shape and hardness of the material, such as metal or glass or plastics, transparent or not transparent, and the like.

A binder or an extender may be used in a sensitive layer or in a protective layer (PC layer). The amount of binder or extender present in an image forming composition may be about 1 to 50% by weight. Examples of such a binder include a styrene-butadiene copolymer, a silicone resin, an alkyd resin, an acid modified polyvinyl chloride, a polyvinylidene chloride, a vinylacetate copolymer, an aldehyde modified PVA-isobutylene copolymer, novolak, cellulose, cellulose acetate, cellulose butylate acetate, chlorinated rubber, gelatin and the like.

Various additives may be used for gradual reduction of fog, improvement of preservation capacity and the like. Typical examples of such additives include sodium bisulfite, 2,6-dibutylparacresol, citric acid, boric acid and pyrophosphoric acid or their salts.

For the purpose of improving sensitivity, preventing surface coloring and improving durability of image, various types of phenols, acid amides and alcohols may be used as additives. Such additives have been proposed by the present inventors and disclosed in JP-A-62-142686. Examples of these additives are a substituted benzamide, an aryloxybenzamide, an alkylthiophenol, a hindered phenol, a xylyeneglycol, a methoxyphenoxy acetamide, an ethoxyphenoxy acetamide, a toluenesulfone amide and the like.

With regard to an agent for use in the prevention of heat polymerization, the following compounds are listed as suitable examples; aromatic hydroxy compounds such as hydroquinone, p-methoxyphenol, p-t-butylcatechol, 2,6-di-t-butyl-p-cresol, $\beta$-naphthol and pyrogallol; quinones such as benzoquinone and p-toluquinone; amines such as naphthylamine, pyridine, p-toludine and phenothiazine; an aluminum salt or an ammonium salt of N-nitrosophenylhydroxylamine; phloranyl; nitrobenzene; and the like.

When necessary, other supplementary auxiliaries may be also used, such as a dispersion agent, a plasticizer, an agent for sag prevention, a leveling agent, an antifoaming agent, a flameproofing agent, a glossing agent, a coloring agent and the like. Typical examples of such supplementary additives include an alkylphenol/formaldehyde novolak resin, a polyvinyl ethyl ether, a polyvinyl isobutyl ether, a polyvinyl butyral, a polyisobutylene, a styrene-butadiene copolymer rubber, a butyl rubber, a vinyl chloride-vinyl acetate copolymer, a chlorinated rubber, an acryl resin preparation, an aromatic, aliphatic or aliphatic ring petroleum resin and the like. As a dispersion agent, a fluorine containing high molecular weight compound, a surfactant, a modified lecithin, a non-silicone long chain carboxylic acid amine salt, octylsulfosuccinate and the like may be useful.

The recording material of the present invention comprises a diazonium salt, a polymerizable coupler, capsules, and, as occasion demands, a photopolymerization initiator, a base and an additive agent, as the main components. The diazonium salt is included in the capsules, while the polymerizable coupler, base and other components may be used either in finely dispersed or emulsified form or by including them also in the capsules.

A coating solution containing such components is applied to the aforementioned various supports, such as paper, synthetic paper, PET and TAC, in such a manner that the resulting coal layer preferably has a thickness of about 2 to 18 microns after drying. The support may be transparent or not transparent. When paper is used as the support, neutral paper, smooth paper, glossy paper and the like as disclosed in, for example, JP-A-55-14281 (corresponding to U.S. Pat. No. 4,255,491), JP-A-58-136492, JP-A-58-69091, JP-A-58-69097 and JP-A-58-65695, may be useful. The use of such materials is described in detail on page 455 of JP-A-62-132675.

The diazonium salt included in capsules and the polymerizable coupler component which may be dispersed, emulsified or encapsulated, may be incorporated into the same layer or divided into different layers. An interlayer may also be formed. Additionally, an emulsion of the polymerizable coupler and the photopolymerization initiator is in the same layer as the capsules containing a photosensitive diazonium salt.

Regarding the application method of the recording material of the present invention to a support, an air knife method, a spray method, a dipping method, a brushing method, a roller coating method, a flow coater method, a curtain coating method, a screen printing method and the like may be useful. When the recording material is applied to a printed wiring plate, a thin film metal and the like, the roller coating method, curtain coating method, screen printing method and the like may especially be preferable.

In the case of the recording material of the present invention, only the irradiated portion is cured by the irradiation of active light.

The exposure light source for use in the photocuring may include a low pressure mercury lamp, a medium pressure mercury lamp, a high pressure mercury lamp, an ultra-high pressure mercury lamp, a xenon lamp, a metal halide lamp, a laser beam and the like. It is preferable to use an exposure apparatus equipped with a high pressure mercury lamp, an ultra-high pressure mercury lamp or a metal halide lamp as an exposure apparatus light source which radiates ultraviolet rays of around 300 nm to 400 nm.

If necessary, the recording material of the present invention may be subjected further to an after-curing treatment step by means of exposure or heat treatment before or after the image formation step.

Heat treatment for the curing may be performed by using a heating apparatus such as a hot air circulation type drying oven, far infrared radiation drying oven, an infrared lamp, a heat/steam iron and the like.

The recording material of the present invention may be subjected to exposure after heat printing or, conversely, heat printing after exposure. Also, the recording material may be subjected to pressurization after exposure or transferred to other support. When the recording material is subjected to pressurization, a transferred image may be obtained more clearly by joint use of a foaming agent, such as disclosed, for example, in JP-A-59-225987 or JP-A-1-97680. Since exposure and fixation can be performed after pressurization, the printing material of the present invention finds versatile use in novel applications.

The preferred size of capsules is about 5 to 10 microns in the case of the use of the pressurization step, and about 3 microns or less, more preferably 2.5 microns or less, most preferably 0.5 to 2.5 microns, in the case of the heat printing. The preferred particle size of the emulsion is 5 microns or less, and in the case of the use of the heat printing the preferred particle is 2.5 microns or less.

In the case of the transfer, it may be convenient to use an ink jet recording type image receiving paper on which a pigment layer having a high oil absorption capacity is coated.

A protective layer which comprises a water soluble polymer, a latex or the like may be coated on the surface of the recording layer, for the purpose of improving matching with head, travelling performance, cloud resistance and the like. The backside of the recording material may also take various modes, such as by receiving a coating of an adhesion or sticking layer, a peeling layer, a magnetic layer and the like.

Examples of the present invention are given below by way of illustration and not by way of limitation. Parts are by weight unless otherwise indicated.

EXAMPLE 1

In a mixed solvent of 24 parts of tricresyl phosphate and 5 parts of ethyl acetate were dissolved 3.45 parts of 4-morpholno-2,5-dibutoxybenzenediazonium hexafluorophosphate (a diazo compound) and 18 parts an adduct of xylilene diisocyanate and trimethylolpropane (3:1). The solution of diazo compound was dispersed by emulsification in an aqueous solution of 5.2 parts of polyvinyl alcohol in 58 parts of water at 20° C. to provide an emulsion having a mean particle size of about 2.5 μm. After adding 100 parts of water to the emulsion thus obtained, the mixture was heated to 60° C. with stirring, whereby a capsule dispersion containing the diazo compound as the core material was obtained after 2 hours (to be referred to as "A" hereinafter).

Next, 3 parts of 1-(o-octoxyphenyl)-3-acrylamide-5-pyrazolone, 3 parts of 1-acryloxyethyl-3-methyl-5-pyrazorone, 2.5 parts of trimethylolpropanetriacrylate, 0.2 part of benzoinbutyl, 0.01 part of 2,6-dibutylparacresol and 7 parts of triphenylguanidine and 30 parts of ethyl acetate were used. These were added to 100 parts of 5% PVA aqueous solution containing 0.012 part of sodium dodecylbenzenesulfonate and the mixture was subjected to homogenization using a homogenizer to obtain a solution (to be referred to as "D" hereinafter) containing dispersed particles (mean particle size, 1 micron) of polymerizable coupler, base and stabilizer.

On the other hand, 20 parts of methaphenoxyethoxyacetamide was dispersed in 200 cc of 2% PVA aqueous solution to obtain a dispersion solution (to be referred to as "F" hereinafter) with a particle size of 3 microns.

Thereafter, 25 parts of A, 14 parts of D and 12 parts of F thus prepared were mixed thoroughly and the resulting mixture was applied to a sheet of smooth high quality paper in such amount that a layer of 8 microns in thickness was obtained after drying. In this way, a recording material (to be referred to as "1" hereinafter) was obtained.

EXAMPLE 2

The first step of Example 1 was repeated to obtain a dispersion solution of capsules (to be referred to as "B" hereinafter) except that the diazonium salt was replaced by 2-octyloxy-4-dibutylaminobenzenediazonium hexafluorophosphate and 3 parts of pentaerythritoltriacrylate and 0.02 part of benzoinethyl were added.

The second step of Example 1 was repeated to obtain a dispersion solution (to be referred to as "E" hereinafter) except that 1-(o-octoxyphenyl)-3-acrylamide-5-pyrazolone was replaced by 6 parts of 1-(o-octoxyphenyl)-3-(3-acrylamino)benzoilamino-5-pyrazolone.

Also, a dispersion solution (to be referred to as "G" hereinafter) was prepared in the same manner as solution D of Example 1 except that the amount of triphenylguanidine was changed to 13 parts.

Thereafter, 25 parts of B, 14 parts of E and 14 parts of G thus prepared were mixed thoroughly and the resulting mixture was applied to a sheet of neutral paper in such amount that a layer of 10 microns in thickness was obtained after drying. In this way, a recording material (to be referred to as "2" hereinafter) was obtained.

Synthesis Example 1

Production of 1-o-tolyl-3-N,N-dimethacryloxyethylcarbamoyl-5-pyrazolone:

20 Grams of 1-o-tolyl-3-carboxy-5-pyrazolone was reacted with 2.1 mole equivalent of ethyl chloroformate in 200 ml of chloroform-acetonitrile in a conventional method to form acid anhydride (1-o-tolyl-3-ethoxy-carbonyloxycarbonyl-5-ethoxycarbonyloxypyrazole).

Then, the acid anhydride was reacted with 1 mole equivalent of diethanolamine to form amide thereof, and further treated with aqueous alcoholic KOH to give 1-o-tolyl-3-ethoxycarbonyloxycarbonyl-5-pyrazolone. Thus, a pyrazolone derivative which has two aliphatic hydroxy groups was obtained.

5 Grams of thus obtained product was dissolved in 30 ml of acetonitrile, and 2.3 mole equivalent of methacrylate chloride was added under ice cooling. After stirring for 30 minutes, 4 mole equivalent of triethylamine was added gradually, and further stirred for 2 hours to complete esterification. Then, the reaction mixture was poured into water, extracted with ethyl acetate, and developed by chloroform-acetate (20/1, by volume) using silica gel to separate the desired product. The desired product was isolated as a highly viscous semi-solid. From the data of NMR and MS, the isolated product was confirmed to be the entitled product, 1-o-tolyl-3-N,N-dimethacryloxyethylcarbamoyl-5-pyrazorone.

EXAMPLE 3

3 Parts of 1-o-tolyl-3-N-methacryloxyethylcarbamoyl-5-pyrazolone, 3 parts of 1-o-tolyl-3-N,N-dimethacryloxyethylcarbamoyl-5-pyrazolone obtained in above Synthesis Example 1, 2.5 parts of trimethylolpropanetriacrylate, 0.2 part of benzoinbutyl, 0.01 part of 2,6-di-t-butyl-p-cresol and 30 parts of ethyl acetate were mixed thoroughly, and added to 100 parts of 5% PVA aqueous solution containing 0.012 part of sodium dodecylbenzenesulfonate. The resulting mixture was subjected to homogenization using a homogenizer to obtain a solution (to be referred to as "H" hereinafter) containing dispersed particles (mean particle size, 1 micron) of polymerizable 5-pyrazolone coupler having plural polymerizable groups, polyfunctional polymerizable monomer, photopolymerization initiator, base, and stabilizer.

On the other hand, 20 parts of m-methylphenoxyacetamide was dispersed in 200 cc of 2% PVA aqueous solution to obtain a dispersion solution (to be referred to as "I" hereinafter) with a particle size of 3 microns.

Thereafter, 25 parts of A of Example 1, 14 parts of H and 12 parts of I thus prepared were mixed thoroughly and the resulting mixture was applied to a sheet of smooth high quality paper in such amount that a layer of 8 microns in thickness was obtained after drying. In this way, a recording material (to be referred to as "3" hereinafter) was obtained.

EVALUATION 1

The recording materials 1, 2 and 3 obtained in Examples 1, 2 and 3 were exposed to light using a high pressure mercury lamp of 400 W for 3 minutes at a distance of 20 cm.

When the total area of each of the thus image-exposed recording materials was subjected to heating by using a G III mode thermal printer (Hitachi Hifax 700), only unexposed parts showed clear color development of images.

Monomers and diazonium salts use in the exposure parts were found to be inactivated substantially completely, and discrimination was excellent.

EXAMPLE 4

Example 1 was repeated to obtain a recording material (to be referred to as "4" hereinafter) except that the size of the capsules containing the diazonium salt were formed into a size of 6 microns and the solution F was not used.

EVALUATION 2

The recording materials 4 was subjected to image exposure in the same manner as Evaluation 1. When the resulting recording material was subjected to a pressurization process, only unexposed parts showed clear magenta color images. The thus recorded images were able to be converted into solvent-insoluble images by further exposure.

An excellent fixed image was obtained also when the recording material 4 was first pressurized into a form of an image and then subjected to exposure.

These images obtained above were fixed well and were remarkably stable even under various conditions described in the aforementioned patents.

Thus, it is apparent that there has been provided, in accordance with the present invention, a recording material comprising a system which gives an image by light, heat or pressure or by a combination thereof.

While the invention has been described in detail and with reference to specific embodiments thereof, it will be apparent to one skilled in the art that various changes and modifications can be made therein without departing from the spirit and scope thereof.

What is claimed is:

1. An image-forming method which comprises steps of:
   imagewise exposing a recording material comprising a support having provided thereon capsules containing a photosensitive diazonium salt, and a polymerizable coupler having at least one photopolymerizable group;
   heating the total area of the exposed recording material to form an image at an unexposed portion of the recording material; and
   exposing the total area of the recording material to light or heat to cause polymerization at the unexposed image portion.

2. An image-forming method as in claim 1, wherein said recording material further comprises a photopolymerization initiator which enhances the photopolymerization of said polymerizable coupler.

3. An image-forming method as in claim 2, wherein said polymerizable coupler and said photopolymerization initiator are provided on the support in an emulsion.

4. An image-forming method as in claim 3, wherein the emulsion of said polymerizable coupler and said photopolymerization initiator is in the same layer as the capsules containing a photosensitive diazonium salt.

5. An image-forming method as in claim 3, wherein said emulsion has a particle size of 2.5 microns or less.

6. An image-forming method as in claim 1, wherein said capsules have a particle size of 2.5 microns or less.

* * * * *